(12) United States Patent
Yamamoto et al.

(10) Patent No.: US 7,233,541 B2
(45) Date of Patent: Jun. 19, 2007

(54) STORAGE DEVICE

(75) Inventors: Takashi Yamamoto, Aichi (JP); Kenichi Satori, Tokyo (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 11/146,677

(22) Filed: Jun. 7, 2005

(65) Prior Publication Data
US 2005/0281104 A1 Dec. 22, 2005

(30) Foreign Application Priority Data
Jun. 16, 2004 (JP) ............................. 2004-178447

(51) Int. Cl.
*G11C 8/00* (2006.01)
*G11C 7/00* (2006.01)
(52) U.S. Cl. .................... 365/230.03; 365/63; 365/220
(58) Field of Classification Search ........... 365/230.03, 365/220, 63
See application file for complete search history.

(56) References Cited

U.S. PATENT DOCUMENTS 5,844,856 A * 12/1998 Taylor .................. 365/230.05
6,668,308 B2 * 12/2003 Barroso et al. ............. 711/141
2003/0149832 A1 8/2003 Kaki et al.
2003/0182528 A1 9/2003 Ajiro

FOREIGN PATENT DOCUMENTS

EP 1 262 988 12/2002
WO WO 99/44113 9/1999

* cited by examiner

*Primary Examiner*—Son Dinh
(74) *Attorney, Agent, or Firm*—Robert J. Depke; Rockey, Depke, Lyons & Kitzinger LLC.

(57) ABSTRACT

The present invention is intended to significantly enhance processing efficiency. The card-type semiconductor storage device has a first data communication line group for connecting nonvolatile memories in a first port to a controller block and a second data communication line group for connecting nonvolatile memories in a second port to the controller block.

11 Claims, 8 Drawing Sheets

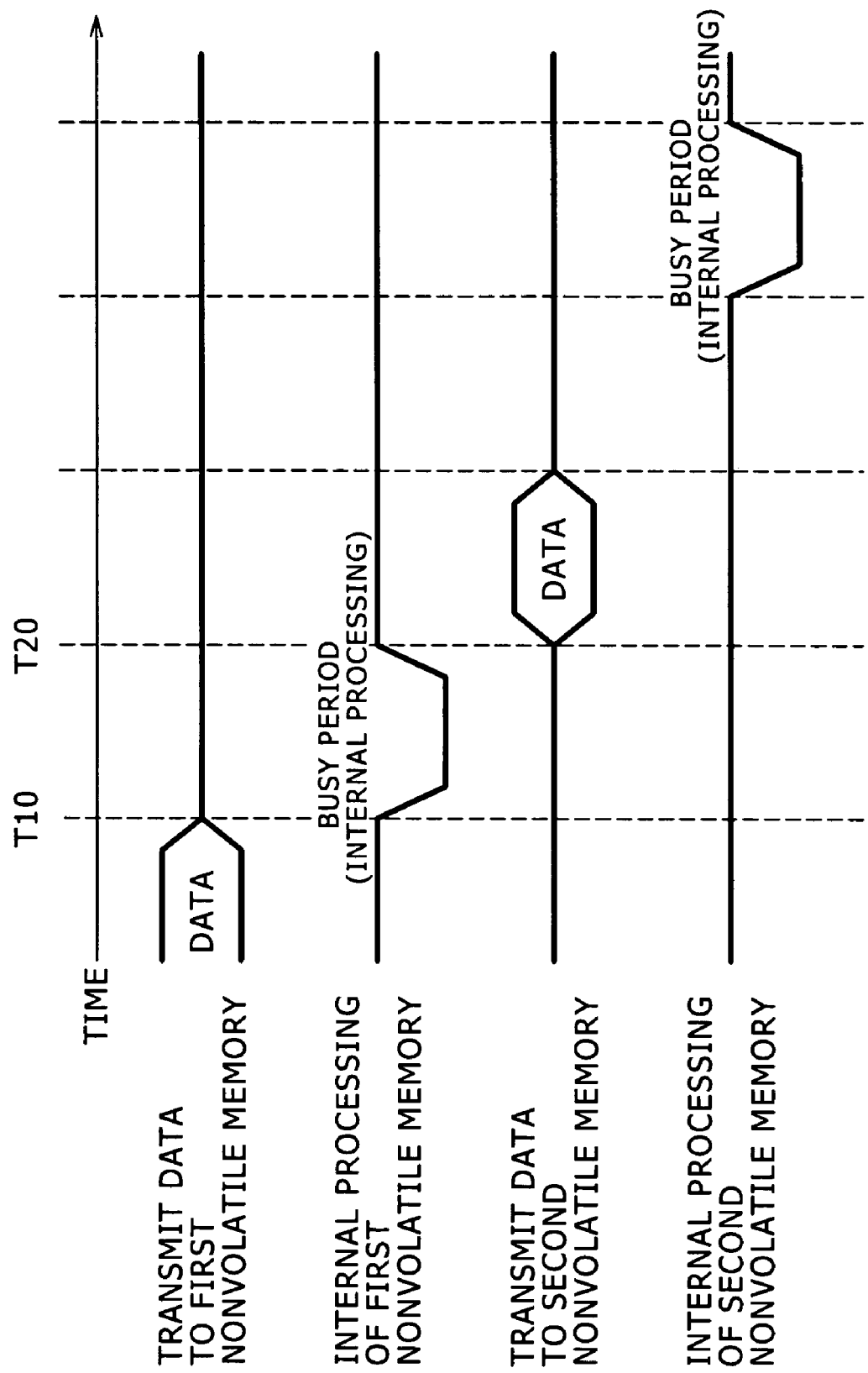

STORAGE DEVICE

BACKGROUND OF THE INVENTION

The present invention relates to a storage device and is suitably applicable to a semiconductor storage device having a plurality of memories (or memory chips).

Various types of storage devices having a plurality of memories for storing data have been in wide use. Some of the recently popularized semiconductor storage devices have each a plurality of nonvolatile memories (namely, flash memories) as memory functionality (refer to Japanese Patent Laid-open No. Sho 64-78354).

These recent semiconductor storage devices are each designed for connection with an information processing apparatus such as personal computers to function as external storage devices for storing data from the connected information processing apparatus.

Now, with reference to FIG. 7, there is shown an exemplary configuration of such a semiconductor storage device as mentioned above. This semiconductor storage device has a first nonvolatile memory and a second nonvolatile memory to which data is written and a controller block for sending data to be written to each of the first nonvolatile memory and the second nonvolatile memory. In this example, each of the first and second nonvolatile memories has 8-bit data input/output terminals and the controller block also has 8-bit data input/output terminals.

The controller block is connected to the first nonvolatile memory via a data communication line group made up of eight data communication lines (namely a data bus with 8-bit bus width) for example and connected to the second nonvolatile memory via a data communication line group separated from the above-mentioned data communication line group.

As shown in FIG. 8 for example, after the controller block has transmitted data to be written to the first nonvolatile memory via the data communication line group (timing T10), the first nonvolatile memory executes internal processing for writing the received data to an internal storage area thereof. Upon successful completion of this internal processing, the first nonvolatile memory transmits a signal for telling the completion (hereafter referred to as "completion notice signal") to the controller block via the data communication line group (timing T20).

Consequently, in this semiconductor memory device, the data communication line group is kept in an occupied state by the data communication between the controller block and the first nonvolatile memory until the controller block receives the completion notice signal from the first nonvolatile notice signal (timing T20) even after the controller block has transmitted the data to the first nonvolatile memory (timing T10).

This presents a problem in processing efficiency owing to the fact that, although this controller block is ready for starting data transmission processing to transmit data to the second nonvolatile memory at timing T10, the controller block cannot actually start the data transmission processing until timing T20 at which the occupied data communication line group is available.

SUMMARY OF THE INVENTION

It is therefore an object of the present invention to provide a storage device that significantly enhances processing efficiency.

In carrying out the invention and according to an embodiment of the present invention, there is provided a storage device including: a first memory group and a second memory group each having a plurality of memories; a data communication block for executing data communication with each of the plurality of memories; a first data communication line group for connecting each of the plurality of memories in the first memory group to the data communication block; and a second data communication line group for connecting each of the plurality of memories in the second memory group to the data communication block.

Arranging the first data communication line group for connecting each memory in the first memory group to the data communication block and the second data communication line group for connecting each memory in the second memory group to the data communication block as described above allows data communication with one of the memories in the second memory group via the second data communication line group, while the first data communication line group is occupied by the data communication processing for one of the memories in the first memory group.

According to the present invention, the first data communication line group for connecting each memory in the first memory group to the data communication block and the second data communication line group for connecting each memory in the second memory group to the data communication block are arranged, so that, while the fist data communication line group is occupied by the data communication processing for one of the memories in the first memory group, the data communication with one of the memories in the second memory group via the second data communication line group is enabled, thereby significantly enhancing processing efficiency.

BRIEF DESCRIPTION OF THE DRAWINGS

FIG. 8 is a timing chart indicative of a related-art data write operation.

DETAILED DESCRIPTION OF THE PREFERRED EMBODIMENTS

The following describes in detail one embodiment of the present invention with reference to accompanying drawings.

Figure 1:
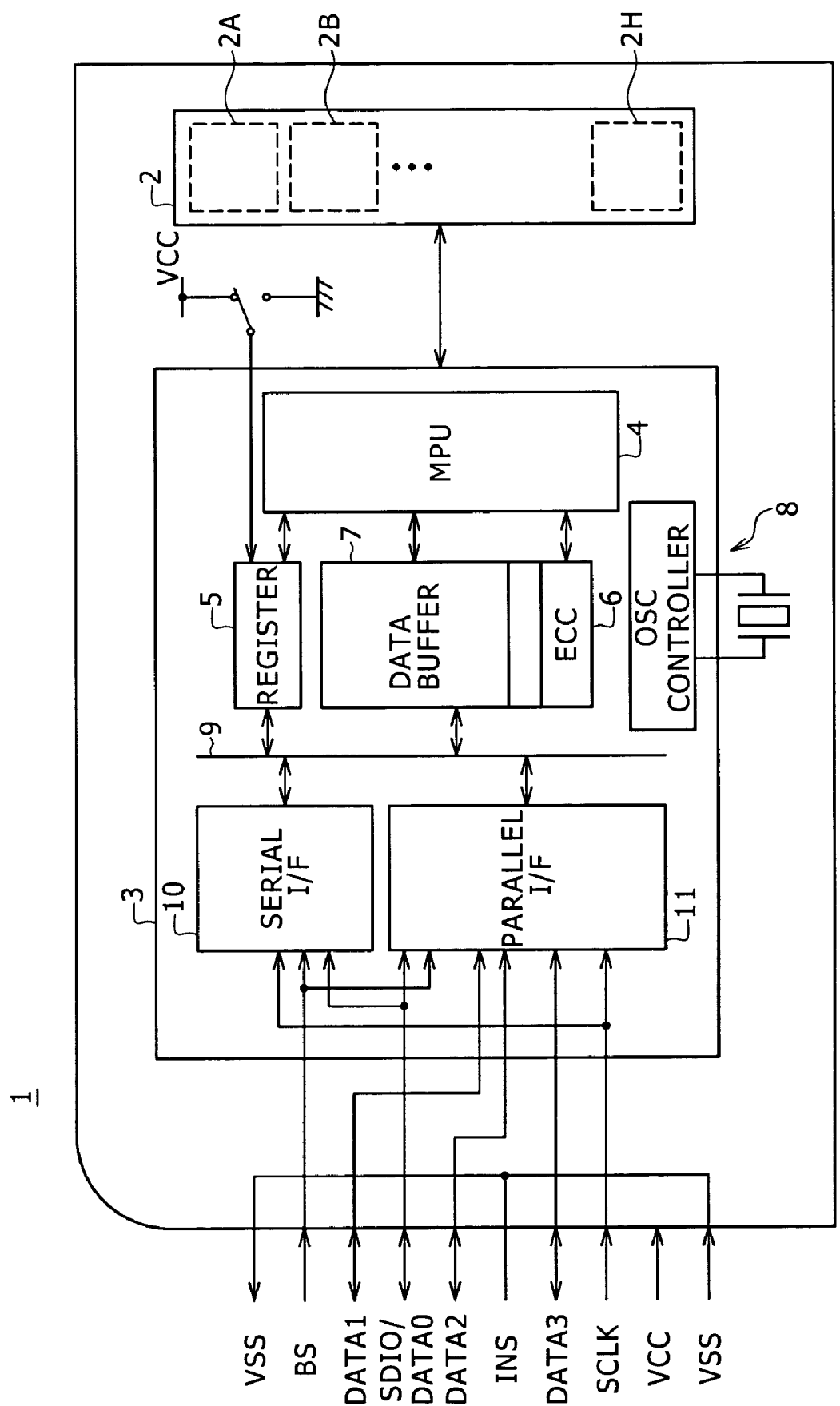
FIG. 1 is a block diagram illustrating a card-type semiconductor storage device practiced as one embodiment of the invention.

Now, referring to FIG. 1, reference numeral 1 denotes a card-type semiconductor storage device that has a memory block 2 made up of eight nonvolatile memories 2A through 2H for example and a controller block 3 for executing data read/write processing on the memory block 2.

In the case of the present embodiment, the card-type semiconductor storage device 1 is equivalent to the Memory Stick (trademark) and data supplied from an external device such as a personal computer for example is written to the card-type semiconductor storage device 1.

In the controller block 3, an MPU (Micro Processing Unit) 4 for executing control is connected to a register block 5 made up of an instruction register for example, an ECC (Error Correcting Circuit) 6 for executing error correction processing for example, and a data buffer block 7 in which data to be read/written on the memory block 2 is temporarily stored. The controller block 3 also has a clock generator block 8 for generating MS (Memory Stick) internal clocks.

The data buffer block 7 is connected to a serial interface block 10 and a parallel interface block 11 via a predetermined bus 9. Data supplied from an external device is inputted in the data buffer block 7 via predetermined lines (DATA0 through DATA3) and the parallel interface block 11, and (DATA0) and the serial interface block 10. The MPU 4 writes the data inputted in the data buffer block 7 to the memory block 2.

The card-type semiconductor storage device 1 is supplied with power via predetermined lines (VSS and VCC). The card-type semiconductor storage device 1 also has a line (SCLK) in which a clock necessary for capturing data from an external device is inputted, a line (INS) in which a signal for determining whether the card-type semiconductor storage device 1 is normally loaded in an external device is inputted, and a line (BS) in which a signal for determining the direction of data supplied from an external device is inputted, for example.

Figure 2:
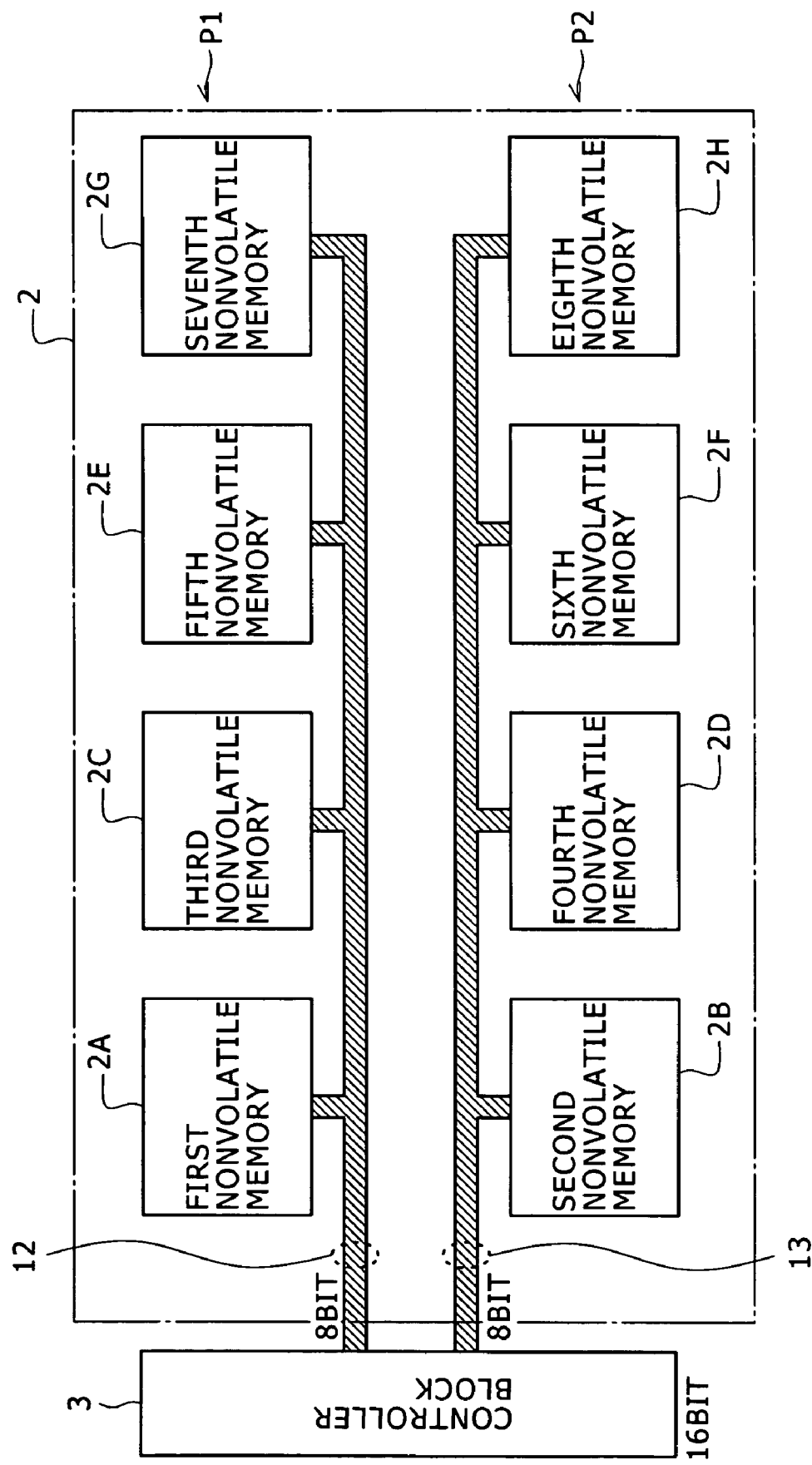
FIG. 2 is a block diagram illustrating a connection form (1) in which a controller block is connected to nonvolatile memories.
Figure 3:
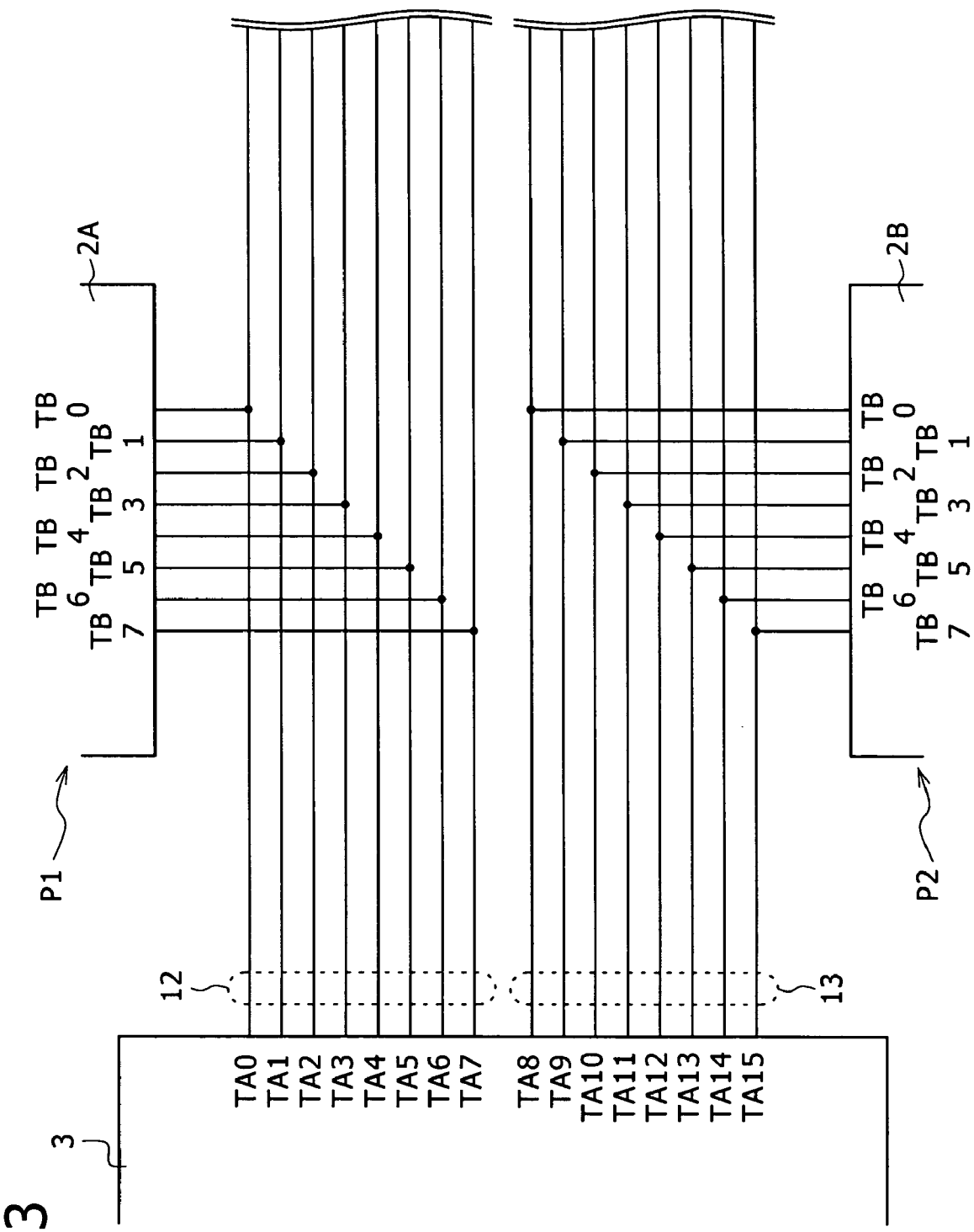
FIG. 3 is a partial block diagram illustrating a connection form (2) in which the controller block is connected to nonvolatile memories.

The following describes in detail connection forms in which the nonvolatile memories 2A through 2H are connected to the controller block 3, with reference to FIGS. 2 and 3.

In the case of the present embodiment, the controller block 3 has 16-bit data input/output terminals (namely 16 input/output terminals) TA0 through TA15 and each of nonvolatile memories 2A through 2H has 8-bit data input/output terminals (namely eight input/output terminals) TB0 through TB7.

The upper 8-bit data input/output terminals TA0 through TA7 of the controller block 3 are connected to the data input/output terminals TB0 through TB7 of each of the nonvolatile memories 2A, 2C, 2E, and 2G in a first port P1 via a first data communication line group 12 made up of eight data communication lines. On the other hand, the lower 8-bit data input/output terminals TA8 through TA15 are connected to the data input/output terminals TB0 through TB7 of each of nonvolatile memories 2B, 2D, 2F, and 2H in a second port P2 via a second data communication line group 13 made up of eight data communication lines.

Figure 4:
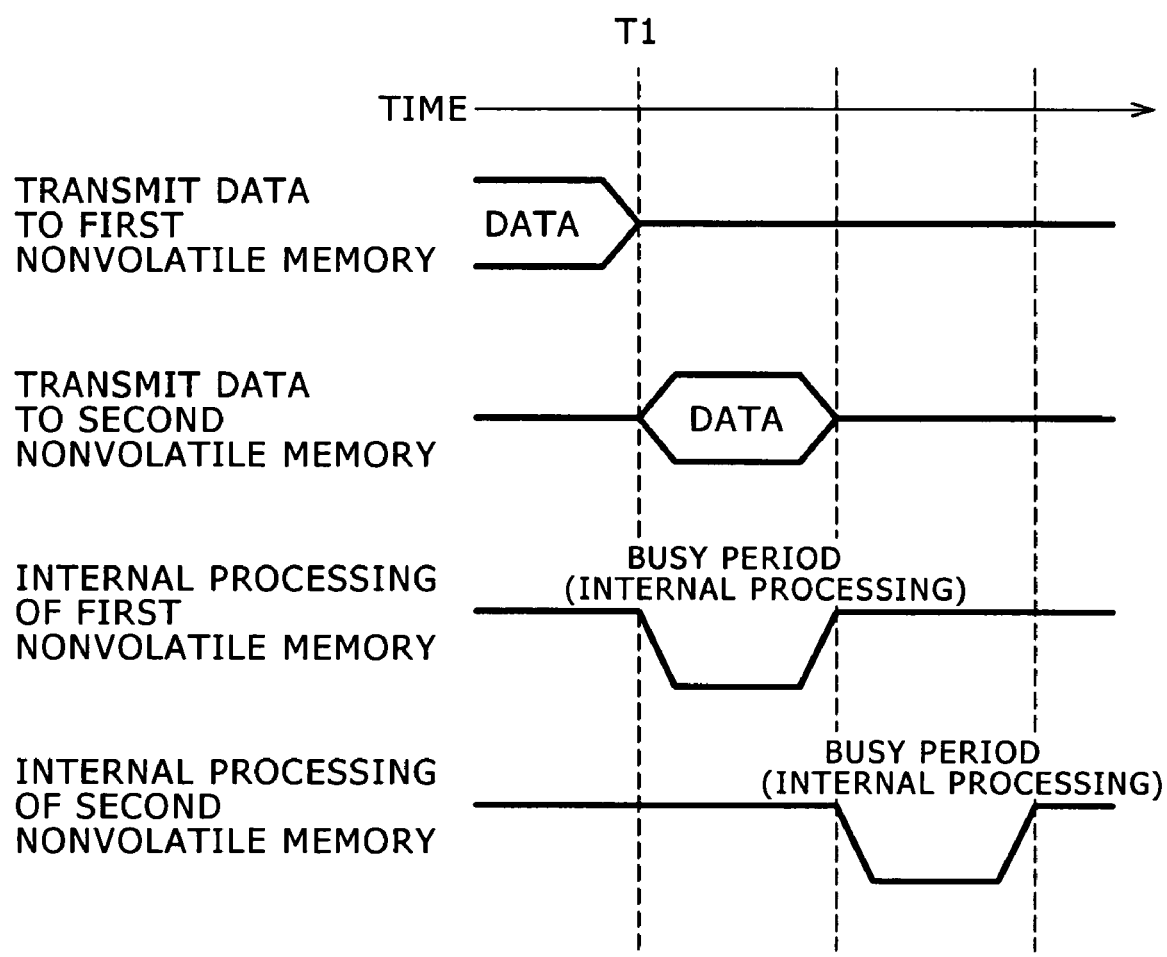
FIG. 4 is a timing chart indicative of a continuous data write operation.

The following describes an operation of continuously writing data to the first nonvolatile memory 2A and the second nonvolatile memory 2B by way of example with reference to FIG. 4.

The controller block 3 transmits data to be written to the first nonvolatile memory 2A in the first port P1 via the first data communication line group 12. Timing T1 at which this transmission has been completed is a timing at which the first nonvolatile memory 2A has started executing internal processing for writing the data. Therefore, because the controller block 3 has not yet received a completion notice signal from this first nonvolatile memory 2A, the first data communication line group 12 is still in an occupied state but the data communication line group 13 is ready for use.

Consequently, even immediately after (timing T1) the completion of the data transmission processing on the first nonvolatile memory 2A in the first port P1, the controller block 3 is able to transmit the data to be written to the second nonvolatile memory 2B in the second port P2 via he data communication line group 13.

Figure 5:
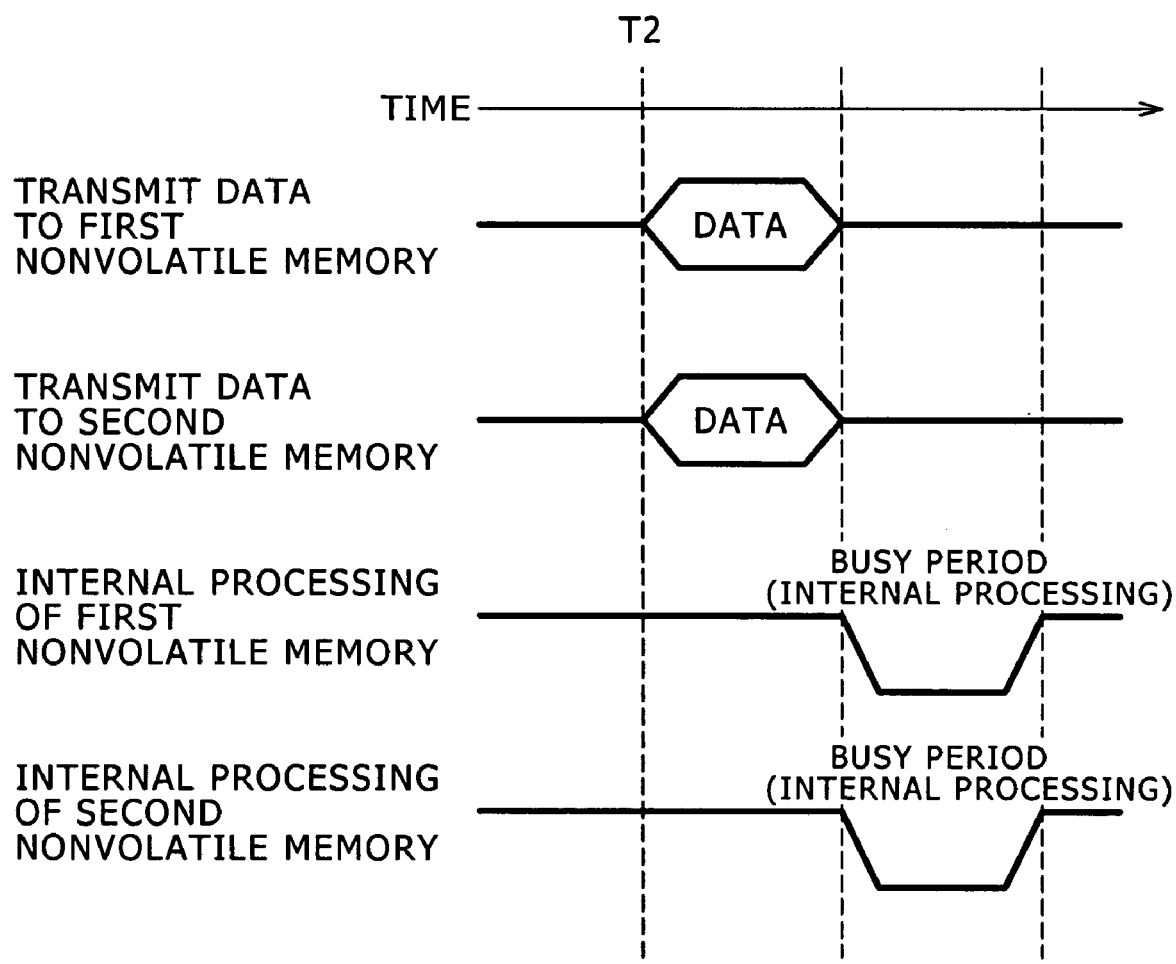
FIG. 5 is a timing chart indicative of a concurrent data write operation.

The following describes an operation of concurrently writing data to the first nonvolatile memory 2A and the second nonvolatile memory 2B with reference to FIG. 5.

The controller block 3 transmits data to be written to the first nonvolatile memory 2A in the first port P1 via the first data communication line group 12. At timing T2 at which the transmission has started, the first data communication line group 12 is in the occupied state but the data communication line group 13 is ready for use.

Consequently, at the same time as the timing at which the transmission of data to the first nonvolatile memory 2A has started (timing T2), the controller block 3 is able to transmit data to be written to the second nonvolatile memory 2B in the second port P2 via the data communication line group 13.

Thus, in the card-type semiconductor storage device 1, even if the controller block 3 has executed data transmission processing on any one of the nonvolatile memories (in this example, the first nonvolatile memory 2A) in the first port P1 via the first data communication line group 12, the controller block 3 is able to use the data communication line group 13 that is in an available state and execute data transmission processing on any one of the nonvolatile memories (in this example, the second nonvolatile memory 2B) in the second port P2. As a result, the card-type semiconductor storage device 1 significantly enhances processing efficiency as compared with related-art technologies.

As described above, the card-type semiconductor storage device 1 has the first data communication line group 12 for connecting the nonvolatile memories 2A, 2C, 2E, and 2G in the first port P1 to the controller block 3 and the data communication line group 13 for connecting the nonvolatile memories 2B, 2D, 2F, and 2H in the second port P2 to the controller block 3.

This novel configuration allows the execution of data transmission processing on any one of the nonvolatile memories 2B, 2D, 2F, and 2H in the second port via the data communication line group 13, while the first data communication line group 12 is occupied by the data transmission processing executed on any one of the nonvolatile memories 2A, 2C, 2E, and 2G in the first port P1, thereby significantly enhancing processing efficiency.

Figure 6:
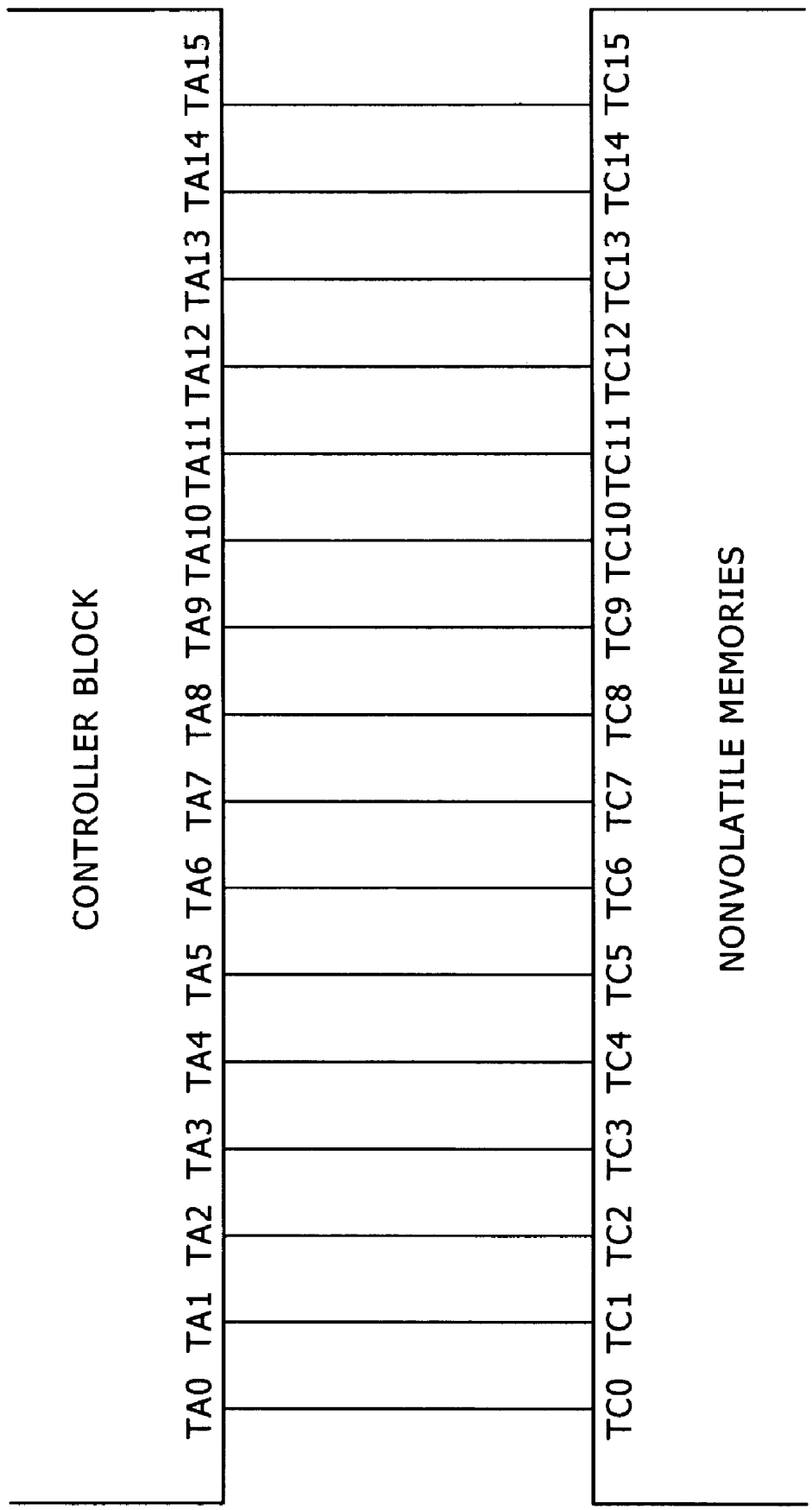
FIG. 6 is a partial block diagram illustrating a connection form in which the controller block is connected to a 16-bit nonvolatile memory.
Figure 7:
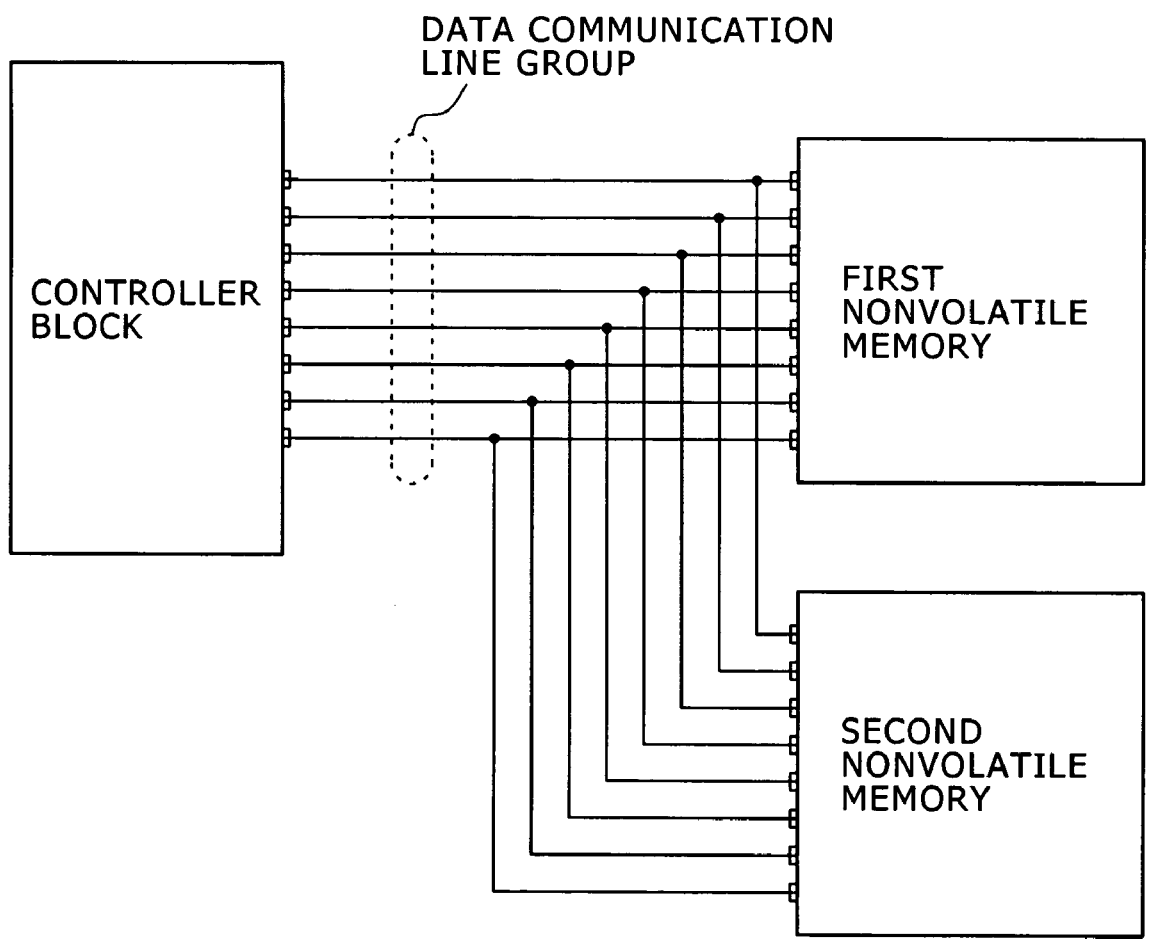
FIG. 7 is a block diagram illustrating a related-art connection form.

It should be noted that, in the present embodiment, the controller block 3 of the card-type semiconductor storage device 1 has 16-bit data input/output terminals TA0 through TA15, so that the controller block 3 may be connected to not only each of the nonvolatile memories 2A through 2H having 8-bit data input/output terminals TB0 through TB7, but also any nonvolatile memory that has 16-bit data input/output terminals TC0 through TC15 as shown in FIG. 6 for example, thereby providing a significant advantage in universality too.

Also, in the present embodiment, if data is sporadically supplied from an external device to the card-type semiconductor storage device 1 and the controller block 3 in the card-type semiconductor storage device 1 must write the sporadically supplied data to the first and second nonvolatile memories 2A and 2B for example, the controller block 3 executes processing for concurrently transmitting the data as shown in FIG. 5. In contrast, if data is continuously supplied from an external device to the card-type semiconductor storage device 1 and the controller block 3 in the card-type semiconductor storage device 1 must write the continuously supplied data to the first and second nonvolatile memories 2A and 2B for example, the controller block 3 executes processing for continuously transmitting the data as shown in FIG. 4. Thus, the card-type semiconductor storage device 1 selects between the continuous transmission and the concurrently transmission depending on situation, thereby significantly enhancing processing efficiency.

Further, in the present embodiment, setting information for setting whether to continuously transmit or concurrently transmit data may be stored in the register block 5 in the card-type semiconductor storage device 1 in advance. In this case, the controller block 3 selects one of the continuous transmission and the concurrent transmission on the basis of the setting information stored in the register block 5. This novel configuration allows the user to rewrite the setting information stored in the register block 5 by means of a predetermined device, thereby making the card-type semiconductor storage device 1 execute user-specified data transmission processing.

Still further, in the present embodiment, depending on the type of data (or content) to be supplied from an external device to the card-type semiconductor storage device 1 or the contents of processing (or an application) being executed in an external device, the user may change settings from one in which the first and second nonvolatile memories 2A and 2B are simultaneously accessed (FIG. 5) to another in which these nonvolatile memories are accessed one after the other (FIG. 4). Using the setting in which the nonvolatile memories are accessed one after the other eliminates the necessity for using both the first data communication line group 12 and the data communication line group 13 at the same time, thereby saving power dissipation.

With reference to the above-mentioned embodiment, the card-type semiconductor storage device 1 for storing data into nonvolatile memories, but not exclusively, is applied as a storage device; for example, any of various other devices such as a personal computer for example may be applied as far as that has a plurality of memories for storing data.

In the above-mentioned embodiment, the nonvolatile memories 2A through 2H, but not exclusively, are applied as the memory functionality; for example, any of various other memories such as a RAM (Random Access Memory) for example may be applied as far as that is able to store data.

Further, in the above-mentioned embodiment, the controller block 3 has the 16-bit data input/output terminals TA0 through TA15, 8-bit data input/output terminals TA0 through TA7 thereof being connected to the first nonvolatile memory 2A having 8-bit data input/output terminals TB0 through TB7 via the first data communication line group 12, and the remaining 8-bit data input/output terminals TA8 through TA15 being connected to the second nonvolatile memory 2B having 8-bit data input/output terminals TB0 through TB7 via the data communication line group 13. The present invention is not limited to this configuration; for example, the controller block 3 may have 32-bit data input/output terminals and each of the nonvolatile memories 2A through 2H may have 16-bit data input/output terminals.

Moreover, in the above-mentioned embodiment, the controller block 3 is applied as the data communication block for data communication with the memories in the first memory group (the nonvolatile memories belonging to the first port P1) and the memories in the second memory group (the nonvolatile memories belonging to the second port P2). However, the present invention is not limited to this configuration; for example, various other configurations are also applicable.

The present invention is applicable to any of semiconductor storage devices each having a plurality of nonvolatile memories.

While a preferred embodiment of the present invention has been described using specific terms, such description is for illustrative purpose only, and it is to be understood that changes and variations may be made without departing from the spirit or scope of the following claims.

What is claimed is:

1. A storage device comprising:
   a first memory group and a second memory group each having a plurality of discrete memory components;
   a data communication block for executing data communication with each of said plurality of discrete memory components in at least one of said first and second memory groups simultaneously;
   a first data communication bus for connecting each of said plurality of discrete memory components in said first memory group to said data communication block; and
   a second data communication bus for connecting each of said plurality of discrete memory components in said second memory group to said data communication block,
   wherein said first data communication bus is directly connected to each of said plurality of discrete memory components in said first memory group, and said second data communication bus is directly connected to each of said plurality of discrete memory components in said second memory group.

2. The storage device according to claim 1, wherein said data communication block, after transmitting data to the plurality of discrete memory components in said first memory group via said first data communication bus and while processing of said data is executed by said plurality of discrete memory components in said first memory group, transmits data to said plurality of discrete memory components in said second memory group via said second data communication bus.

3. The storage device according to claim 1, wherein said data communication block transmits data to said plurality of discrete memory components in said first memory group via said first data communication bus and, at the same time, transmits data to said plurality of discrete memory components in said second memory group via said second data communication bus.

4. The storage device according to claim 1, wherein the total width of the data communication buses connected to the data communication block is N bits, and the total width of each data communication bus connected to each of the plurality of discrete memory components is N/2 bits, and wherein N is more than or equal to eight.

5. A storage device comprising:
   a plurality of memory groups M in number and having a plurality of memories contained therein;
   a data communication block for executing data communication with each of said plurality of memories in at least one of said plurality of memory groups simultaneously; and
   a plurality of data communication buses for respectively connecting each of said plurality of memories in each of said memory groups to said data communication block;
   wherein the total width of the data communication buses connected to the data communication block is N bits, and the total width of each data communication bus connected to each of the plurality of memories is N/M bits, wherein M is an integer number more than or equal to two, and wherein N is an integer number more than or equal to eight.

6. The storage device according to claim 1, wherein said data communication block receives data from said plurality of discrete memory components in said first memory group via said first data communication bus and, at the same time, receives data from said plurality of discrete memory components in said second memory group via said second data communication bus, in a same transaction.

7. The storage device according to claim 5, wherein said data communication block simultaneously transmits data to all of said plurality of memories in all of said plurality of memory groups via respective data communication buses in a same transaction.

8. The storage device according to claim 5, wherein said data communication block simultaneously receives data from all of said plurality of memories in all of said plurality of memory groups via respective data communication buses in a same transaction.

9. A storage device comprising:

a plurality of memory groups M in number and having a plurality of memories contained therein;

a data communication block for executing data communication with at least one of said plurality of memories in at least one of said plurality of memory groups; and a plurality of data communication buses for respectively connecting each of said plurality of memories in each of said memory groups to said data communication block;

wherein the total width of the data communication buses connected to the data communication block is N bits, and the total width of each data communication bus connected to each of the plurality of memories is N/M bits, wherein M is an integer number more than or equal to two, and wherein N is an integer number more than or equal to eight.

10. The storage device according to claim 9, wherein said data communication block simultaneously transmits data to all of said plurality of memory groups via respective data communication buses in a same transaction.

11. The storage device according to claim 9, wherein said data communication block simultaneously receives data from all of said plurality of memory groups via respective data communication buses in a same transaction.

* * * * *